(12) United States Patent
Shibata

(10) Patent No.: US 6,552,956 B2
(45) Date of Patent: Apr. 22, 2003

(54) SEMICONDUCTOR MEMORY DEVICE AND NON-VOLATILE SEMICONDUCTOR MEMORY DEVICE PROVIDED WITH A PLURALITY OF INTERNAL COUNTERS

(75) Inventor: Kenji Shibata, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/988,261

(22) Filed: Nov. 19, 2001

(65) Prior Publication Data

US 2002/0168816 A1 Nov. 14, 2002

(30) Foreign Application Priority Data

May 9, 2001 (JP) ........................................ 2001-138859

(51) Int. Cl.[7] ................................................ G11C 8/00
(52) U.S. Cl. ............. 365/233; 365/230.03; 365/230.08; 365/233.5; 365/236
(58) Field of Search ........................... 365/221, 230.03, 365/230.08, 233, 233.5, 236

(56) References Cited

U.S. PATENT DOCUMENTS 6,191,768 B1 * 2/2001 Imamura ..................... 345/204
6,191,992 B1 * 2/2001 Komoto ....................... 365/221

FOREIGN PATENT DOCUMENTS

JP         2000-57777         2/2000

OTHER PUBLICATIONS

ISSCC98/Session 22/SRAM/Paper SP 22.5, Feb. 4, 1998.

* cited by examiner

*Primary Examiner*—Richard Elms
*Assistant Examiner*—VanThu Nguyen
(74) *Attorney, Agent, or Firm*—Arent Fox Kintner Plotkin & Kahn, PLLC

(57) ABSTRACT

A non-volatile semiconductor memory device 1 includes a first address counter 6 and a second address counter 8. The non-volatile semiconductor memory device 1 further includes two control counters, namely, a first control counter 2 and a second control counter 4 for controlling counter values of the first address counter 6 and the second address counter 8, respectively. Thereby, an output from the first control counter 2 and that from the second control counter 4 are inputted to the first address counter 6 and the second address counter 8, respectively to control the number of addresses to be outputted. Since the two pairs of address counter and control counter are provided, the structure of the two-paired counters enables the non-volatile semiconductor circuit device 1 to control the number of addresses to be used corresponding to various operation modes such as readout, write (program), erase and the like, and to allocate address values to the addresses for use sequentially.

36 Claims, 6 Drawing Sheets

FIG.1 CIRCUIT BLOCK DIAGRAM OF NON-VOLATILE SEMICONDUCTOR MEMORY DEVICE DIRECTED TO FIRST EMBODIMENT

FIG.3 CIRCUIT BLOCK DIAGRAM OF NON-VOLATILE SEMICONDUCTOR MEMORY DEVICE DIRECTED TO SECOND EMBODIMENT

FIG.4 CIRCUIT BLOCK DIAGRAM OF NON-VOLATILE SEMICONDUCTOR MEMORY DEVICE DIRECTED TO THIRD EMBODIMENT

BURST OPERATION TIMING CHART OF CONVENTONAL FLASH MEMORY

SEMICONDUCTOR MEMORY DEVICE AND NON-VOLATILE SEMICONDUCTOR MEMORY DEVICE PROVIDED WITH A PLURALITY OF INTERNAL COUNTERS

BACKGROUND OF THE INVENTION

1. Field of the Invention

The present invention relates to a semiconductor memory device having a plurality of operation modes, each operated with its inherent operation speed. More particularly, it relates to a semiconductor memory device and non-volatile semiconductor memory device that conduct successive operations by generating addresses subsequently among different operation modes.

2. Description of Related Art

Recent years, there have been popularized semiconductor memory devices that have a plurality of operation modes, each operated with its inherent operation speed. To be specific, the operation modes are classified into: readout operation; write operation; and erase operation. The readout operation is conducted at high-speed whereas the write and erase operations take much longer than the readout operation because the latter two operations accompany materialistic operations such as charge-injection to a floating gate and charge-emission from there. As semiconductor memory device having a plurality of operation modes among which operation speeds differ significantly, non-volatile semiconductor memory devices such as flash memory have been widely used for portable appliances.

Flash memory has conventionally been used as a device to record comparatively small volume of information such as memory of operational conditions for portable appliance or memory of concise information such as personal notes for user. Therefore, readout and write operations are united to be single operation such that input and output of data is made for single memory cell corresponding to an address given from the external. The operational specification is designed to be compatible with asynchronous static RAM (referred to as SRAM herein after). Erase operation can apply to pluralities of memory cell during one operational cycle. However, similar to readout and write operations, each cycle of erase operation goes in asynchronous with other operation modes.

On the other hand, portable appliances these days are required to handle even larger volume of information at high-speed, for example, transmission and receipt of image information by a cellular phone. Therefore, for system of portable appliances, there have been studied specifications having affinity with synchronous dynamic random access memory (SDRAM hereinafter) that operates in synchronous with system clock. Along with the trend, a flash memory is also required to have an operation mode such as burst operation that is compatible with system for SDRAM and changes addresses incessantly. In a word, there has been required a synchronous flash memory.

In design of synchronous flash memory, it is conceived to use structure of SDRAM. That is, provided that an address taken from the external is regarded as a start address, it is conceived of a synchronous flash memory provided with an address counter for counting up an address value in synchronous with a system clock, a control counter for counting burst values and the like.

However, speed of readout operation for a flash memory is determined by electric transmission delay due to its circuit structure. On the other hand, speed of write operation takes significantly longer than that of electric operation speed. This is because data is written in accordance with physical phenomenon called avalanche-breakdown phenomenon caused by high-field application of charges, whereby charges are injected to a floating gate of memory cells to write data. Similar to write operation, speed of erase operation takes significantly longer than that of electric operation because data is erased in accordance with physical phenomenon called tunneling caused by high-field application of charges, whereby charges are emitted from the floating gate of memory cells to erase data. Since the above-described operations are conducted with different mechanism, speeds of the respective operations differ. For example, as for flash memory MBM29LV800TA/BA-70, product of FUJITSU LIMITED, readout operation takes 70 n sec. at maximum as address access time (tACC) whereas program duration (tWHWH1) as write operation time takes 8 $\mu$sec. as standard value and sector-erase duration (tWHWH2) as erase operation time takes 1 sec. as standard value. Speeds of the respective operation modes thus differ significantly. To make comparison with an SDRAM that has only two operation modes, namely, readout and write modes, and speed levels of the two operation modes are generally same, which derives from electric transmission delay due its circuit structure, the flash memory has at least three operation modes and each of the operation modes works along different mechanism. Therefore, it is not feasible that each operation mode of a flash memory makes use of SDRAM circuit structure to realize optimal operation for respective operation modes. This is a problem conventional flash memory faces.

The problem such as the above will be described by referring to FIG. 6 that shows a timing chart regarding burst operation of a flash memory. In FIG. 6, operation condition is set to: burst length=2; write (program) latency=0; and readout latency=2. In synchronous with an external clock signal CLK, a write (program) command PGM is received for Bank A designated by a bank address (Bank Add). PA0, a reference address of an external address (External Add.) is received for the write (program) command PGM. Further on, 2-bit write (program) data D0 and D1 are inputted in synchronous with each cycle of the external clock signal CLK. During a cycle of the clock signal CLK where the write (program) command PGM is inputted, the external address PA0 is set in an address counter as an internal address (Internal Add.). Based on the internal address (Internal Add.), writing (programming) of data D0 in the address PA0 is started. Since write (program) operation is conducted in accordance with the as-mentioned physical phenomenon, including verify operation for verifying completion of correct data-write, it takes long to complete the write (program) operation. After the write (program) operation completes, the address counter makes an increment in the number of address from PA0 to PA1 so as to start writing (programming) data D1 for a new address PA1.

Let us take a case wherein a readout command READ for a Bank B is received in synchronous with an external clock signal CLK to start burst readout operation at time t0 when write (program) operation is being conducted. The bank B is designated by the bank address (Bank Add.) and the readout command READ is a command whose reference address is an external address (External Add.) RA0. Since speed of the readout operation is determined by electric transmission delay due to its circuit structure, data can be outputted in the same manner as operation of SDRAM. However, a cycle of write (program) operation is longer than that of readout operation and cycle lengths of these two operation cycles are great difference, write (program) operation and readout operation cannot share and use one address counter subsequently like bust operation in a conventional SDRAM. That is, since write (program) operation to an address PA1 has not finished at time t0, in case burst-readout operation is inserted, write (program) operation must be suspended and resumed after completion of readout operation so as to avoid a scramble for an address of the address counter. Specifically, in order to stop write (program) operation temporarily, there are needed operations to: stop write (program) operation; drive out a write (program) address from the address counter or record the address driven out in there; drive out a burst value from a control counter or record the valve driven out in there; take a reference address into the address counter for burst-readout operation; set a burst value in the control counter during burst-readout operation and the like. Numbers of operations just for stopping write (program) operation temporarily make the operation system complicated, which is problematic. Similarly, in order to resume write (program) operation, there are needed complicated and numbers of controls to: detect completion of readout operation; take a write (program) address that has been driven out or recorded there into the address counter; take a burst value address that has been driven out or recorded there into the control counter. Thus, resume operation is complicated and problematic, either.

In addition, since a cycle of readout operation and that of write (program) operation differ significantly, it is necessary to switch count cycles of the address counter depending on respective operations. Along with that, switching control of a count-up timing generator circuit or the like must be conducted simultaneously. This makes a manner of control complicated.

Since suspension of write (program) operation accompanies serial complicated controls and switching control of count cycles for the address counter, resumption of write (program) operation after switching needs a predetermined length of delay time ($\hat{1}$ in FIG. 6). Accordingly, in order to surely conduct readout operation at the reference address RA0 after interruption of write (program) operation, a sum of a readout operation time and a delay time until setting the reference address RA0 must be taken as an operation cycle. Since resumption of write operation also accompanies serial complicated controls and switching control of count cycles for the address counter, resumption of write (program) operation after switched needs a predetermined length of delay time ($\hat{2}$ in FIG. 6). Accordingly, a time including a predetermined length of delay time is needed as a resume operation cycle. Due to the inclusion of the delay time, the entire operations for read and write slow down to keep pace with interruption and resumption operation cycles. This is an obstacle to high-speed responsibility for a flash memory.

The above description mentions a case that a readout operation is inserted during a write (program) operation, as an example. However, any combinations of read, write (program), and erase operations need complicated controls because lengths of respective operation cycles differ significantly and this is an obstacle to high-speed responsibility in the event.

SUMMARY OF THE INVENTION

The present invention is intended to solve the foregoing prior art deficiency. Its prime object, in a semiconductor memory device having a plurality of operation modes operated with their respective operation, is to enhance performance of successive operations conducted by generating addresses subsequently for different operation modes. More particularly, it is intended to provide a synchronous nonvolatile semiconductor memory device having operational performance as high as SDRAM.

In order to achieve the above objective, the semiconductor memory device based on one aspect of this invention, which has a first operation mode operable with a first cycle and a second operation mode operable with a second cycle that is longer than the first cycle, comprises: a first address counter that generates addresses with the first operation mode; and a second address counter that generates addresses with the second operation mode.

In the inventive semiconductor memory device, the first address counter generates addresses with the first operation mode by the first cycle whereas the second address counter generates addresses with the second operation mode by the second cycle. Since a second cycle is longer than a first cycle, the second counter takes longer time of a cycle to generate address than the first counter does.

Thereby, in the semiconductor memory device, there can be separately arranged two address counters that have respective operation cycles, namely, the first address counter and the second address counter, to meet two different operation modes, namely, the first operation mode and the second operation mode. Therefore, there occurs no operational conflicts even if addresses directed to the two different operations modes are outputted in the internal simultaneously. Accordingly, even if operation modes are changed, appropriate numbered address can be outputted to address buses at any time without initializing the address counter. Thus there are avoided serial complicated controls such as replacements of address values at the address counters, suspension of operation modes due to the replacements, resumption of the suspended operation and the like. Since there occurs no delay time due to the complicated control operations, high-speed data transfer rate can be realized.

Furthermore, a semiconductor memory device based on another aspect of the invention, that has a first operation mode operable with a first cycle and a second operation mode operable with a second cycle that is longer than the first cycle, comprises: a first address counter that generates addresses in serial order subsequent to a first reference address by first cycle generated in synchronous with a clock signal supplied from an external section with the first operation mode; and a second address counter that generates addresses in serial order subsequent to a second reference address by second cycle generated in asynchronous with a clock signal supplied from an external section with the second operation mode.

In the inventive semiconductor memory device, the first address counter that generates addresses in serial order subsequent to a first reference address by first cycle generated in synchronous with a clock signal supplied from an external section with the first operation mode, and the second address counter that generates addresses in serial order subsequent to a second reference address by second cycle generated in asynchronous with a clock signal supplied from an external section with the second operation mode.

Thereby, there occurs no operational conflicts even if addresses are generated simultaneously from operation modes operable in synchronous with an external clock signal and from other operation mode operable in asynchronous with an external clock signal. Therefore, addresses can be outputted to internal address buses at any time with timing appropriate to respective operation modes without initializing each address counter. Thus there are avoided serial complicated controls such as replacements of address values at the address counters, suspension of operation modes due to the replacements, resumption of the suspended operation and the like. Since there occurs no delay time due to the complicated control operations, high-speed data transfer rate can be realized.

A non-volatile semiconductor memory device based on one aspect of the present invention that has readout mode operable with first cycle and write mode or erase mode operable with second cycle that is longer than the first cycle comprises: a first address counter that generates addresses in serial order subsequent to a first reference address by the first cycle generated in synchronous with a clock signal supplied from an external section with the readout mode; and a second address counter that generates addresses in serial order subsequent toa second reference address by the second cycle generated in synchronous with a clock signal supplied from an external section with either the write mode or the erase mode.

In the inventive non-volatile semiconductor memory device, in the readout mode, the first address counter generates addresses in serial order subsequent to the first reference address by the first cycle, whereas in the write mode or the erase mode, the second address counter generates addresses in serial order subsequent to the second reference address by the second cycle. In this case, both the first cycle and the second cycle are generated in synchronous with clock signals supplied from an external section keeping relationship that a second cycle is longer than a first cycle.

Thus there are used two address counters operable with two different operation cycles, one for readout mode operable in first cycle and the other for write or erase mode operable in second cycle, in the non-volatile semiconductor memory device. Accordingly, there occurs no operational conflicts even if addresses are generated simultaneously from respective operation modes. Even if operation modes are changed, addresses can be outputted to internal address buses at any time without initializing each address counter.

Furthermore, since the first address counter and the second address counter can generate addresses in serial order subsequent to the first reference address and the second reference address, respectively, each of the address counters can dependently generate appropriate addresses in serial order subsequent to respective reference addresses. Therefore, addresses can be outputted to internal address buses at any time based on appropriate reference addresses without initializing each address counter among readout mode, write mode, and erase mode.

Still further, two operation cycles different in length wherein second cycle is longer than first cycle can be synchronized with clock signals supplied from an external section.

Thus there are avoided serial complicated controls such as replacements of address values at the address counters, suspension of operation modes due to the replacements, resumption of the suspended operation and the like. Since there occurs no delay time due to the complicated control operations, high-speed data transfer rate can be realized.

A non-volatile semiconductor memory device based on another aspect of the present invention that has readout mode operable with first cycle and write mode or erase mode operable with second cycle that is longer than the first cycle comprises: a first address counter that generates addresses in serial order subsequent to a first reference address by the first cycle generated in synchronous with a clock signal supplied from an external section with the readout mode; and a second address counter that generates addresses in serial order subsequent to a second reference address by the second cycle generated in asynchronous with a clock signal supplied from an external section with either the write mode or the erase mode.

In the inventive non-volatile semiconductor memory device, in the readout mode, the first address counter generates addresses in serial order subsequent to the first reference address by the first cycle, whereas in the write mode or the erase mode, the second address counter generates addresses in serial order subsequent to the second reference address by the second cycle. In this case, the first cycle is generated in synchronous with a clock signal outputted from an external section whereas the second cycle is generated in asynchronous with a clock signal.

Thereby, even if it is between readout mode operable in synchronous with external clock signals and write or erase mode operable in asynchronous with external clock signals, there occurs no operational conflicts even if addresses are generated simultaneously from respective operation modes there. Therefore, addresses can be outputted to internal address buses at any time with timing appropriate to respective operation modes without initializing each address counter. Thus there are avoided serial complicated controls such as replacements of address values at the address counters, suspension of operation modes due to the replacements, resumption of the suspended operation and the like. Since there occurs no delay time due to the complicated control operations, high-speed data transfer rate can be realized.

The above and further objects and novel features of the invention will more fully appear from following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

Preferred embodiments will semiconductor memory device provided with a plurality of internal counters and non-volatile semiconductor memory devices based on this invention in detail with reference to FIG. 1 through FIG. 5. First through Third Embodiments constitute the Preferred Embodiments.

Figure 1:
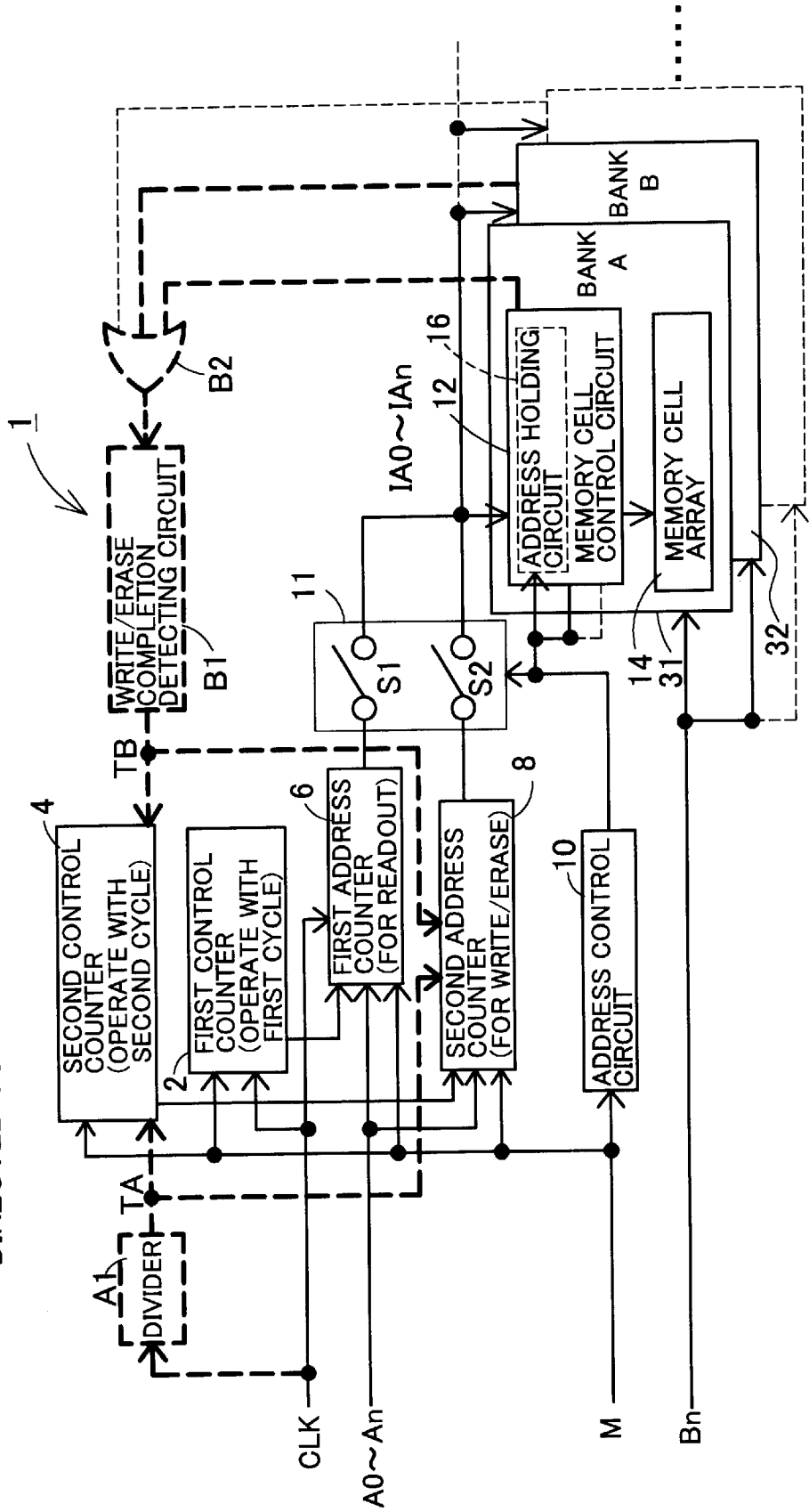
FIG. 1 is a circuit block diagram of a non-volatile semiconductor memory device directed to First Embodiment.

As shown in FIG. 1, a circuit block diagram for a non-volatile semiconductor memory device 1 directed to a First Embodiment includes two address counters, namely, a first address counter 6, and a second address counter 8. The non-volatile semiconductor memory device further includes two control counters, namely a first control counter 2 and a second control counter 4. The two control counters handle counter values of the first address counter 6 and the second address counter 8. Outputs of the first control counter 2 and those of the second control counter 4 are inputted to the first address counter 6 and the second address counter 8, respectively, thereby to control the number of addresses to be outputted from there. There are thus provided with the two pairs of counters, namely, a first address counter 6—first control counter 2 pair, and a second address counter 8—second control counter 4 pair. The structure of the two-paired counters enables the non-volatile semiconductor circuit device 1 to control the number of addresses to be used and to allocate address values to the addresses for use sequentially depending on various operation modes such as readout, write (program), erase and the like.

The first address counter 6 is used for readout operation. The first address counter 6 receives: a reference address RA0; an initial address for readout operation, from external address terminals A0 through An; an external clock signal CLK as a count-up signal; and a mode signal M for setting operation mode.

The first control counter 2 and the first address counter 6 work together along with a first cycle. Similar to the first address counter 6, the first control counter 2 receives an external clock signal CLK as a count-up signal and a mode signal M. Here, the first cycle is a cycle that begins in synchronous with an external clock signal CLK. The first cycle may coincide with a cycle of the external clock signal CLK or a cycle divided from a cycle of the external clock signal CLK. The first control counter 2 controls the number of bursting for readout operation and generates address values with a first cycle with the aid of the external clock signal CLK, the first control counter 2 works in synchronous with the first address counter 6.

The second address counter 8 is used for write (program) or erase operation. Similar to the first address counter 6, the second address counter 8 receives: a reference address PA0, an initial address for write (program) or erase operation; and a mode signal M. As a count-up signal, instead of the external clock signal CLK, either a divided signal TA via a divider A1 or a signal TB outputted from a write (program)/erase completion detecting circuit B1 is inputted to the second control counter 4. A divided signal TA corresponds to an external clock signal divided by the divider A1. A signal TB corresponds to a verification that has been transmitted from a memory cell control circuit 12 of each bank such as Bank A (31), Bank B(32) . . . , described later, to the write (program)/erase completion detecting circuit B1 through an OR gate B2. A verification signal is to verify completion of write (program) or erase operation at each bank. A divided signal TA, obtained by dividing an external clock signal CLK, has a divided value that secures a time required to complete write (program) or erase operation. A cycle of a divided signal TA is longer than a first cycle. The signal TB is a signal asynchronous with an external clock signal CLK and its cycle is longer than a first cycle, as well.

The second control counter 4 and the second address counter 8 work together along with a second cycle. Similar to the first control counter 2, the second control counter 4 receives: a mode signal M; and either a divided signal TA or a control signal TB, instead of an external clock signal CLK. The second control counter 4 controls the number of bursting during write (program) or erase operation and generates address values within a second cycle determined by a divided signal TA or a signal TB in synchronous with the second address counter 8.

Each signal outputted from the first address counter 6 and the second address counter 8 is inputted to a selective switch circuit 11. TO be specific, a signal outputted from the first address counter 6 is connected to a switch S1 in the selective switch circuit 11 and a signal from the second address counter 8 is connected to a switch S2. Lines extending from the other terminals of the switch S1 and the switch S2 are connected together and branch off from the common connection point with being connected to each bank (Bank A(31), Bank B(32) . . . ) as internal address buses IA0 through IAn. Furthermore, the selective switch circuit 11 receives a selection signal from an address control circuit 10 to which a mode signal M has been inputted. The selective signal selectively switches output signals from the first address counter 6 and those from the second address counter 8 to supply a selected output signal to the internal address buses IA0 through IAn.

Each bank (Bank A (31), Bank B(32) . . . ) has an identical structure. Let us take an example of a Bank A (31). The Bank A (31) includes a memory cell array 14 consisting of a predetermined number of memory cells. The Bank A (31) receives and outputs various signals and data such as control signals and data from a memory cell control circuit 12, to conduct access operations such as readout, write (program), erase or the like for subject addresses in the memory cell array 14. The memory cell control circuit 12 has an address holding circuit 16. Furthermore, a bank selection signal Bn is inputted to the Bank A (31) and a selection signal from the address control circuit 10 is inputted to the address holding circuit 16. Among the plurality of Banks 31, 32 . . . , the bank activated by a bank selection signal Bn receives addresses corresponding to an operation mode selected by a mode signal M. Since the internal address buses IA0 through IAn are connected to the Banks A (31), B (32) . . . , respectively, appropriate activation and selection among banks enable the non-volatile semiconductor memory device 1 to conduct interleave operation.

Furthermore, since the address holding circuit 16 holds an address from the internal address buses IA0 through IAn, even after an operation mode is switched to other one and address supply is switched to other bank due to inputs of bank selection signal Bn and a mode signal M, a bank which is active at the point of switching can keep holding the address. In accordance with the address held at the bank, the operation can continue and terminate. Even if readout operation for other bank starts in the middle of write (program) or erase operation, the write (program) or erase operation can continue and terminate.

Although not shown in the drawings, in case time necessary to finish write (program) operation and time necessary to finish erase operation do not coincide, values to be set at the divider A1 or the program/erase completion detecting circuit B1 may be changed based on a mode signal M or the like so as to switch length of a second cycle by changing an output cycle of the divided signal TA or that of a signal TB.

Figure 2:
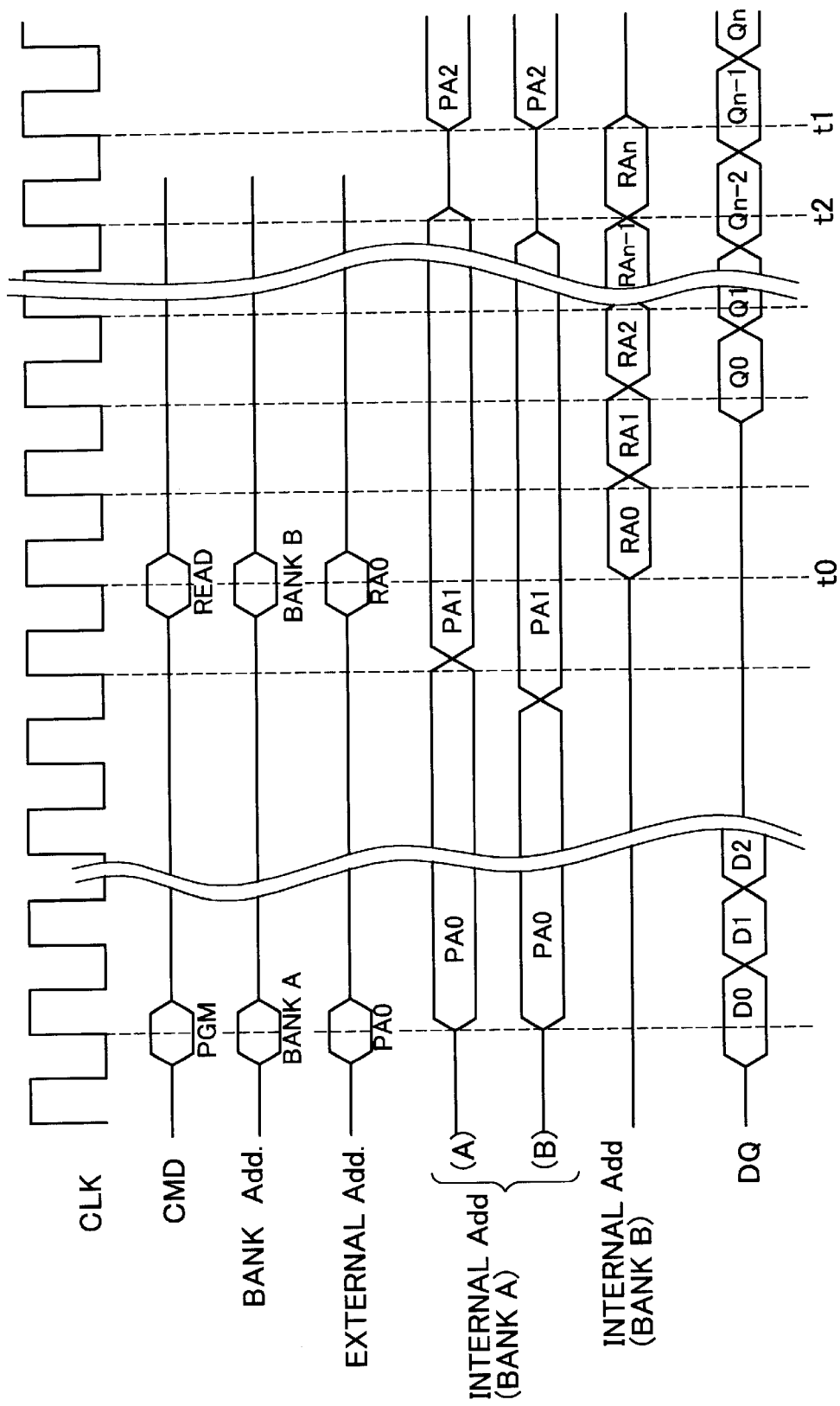
FIG. 2 is a burst operation timing chart of the non-volatile semiconductor memory device directed to First Embodiment.
Figure 6:
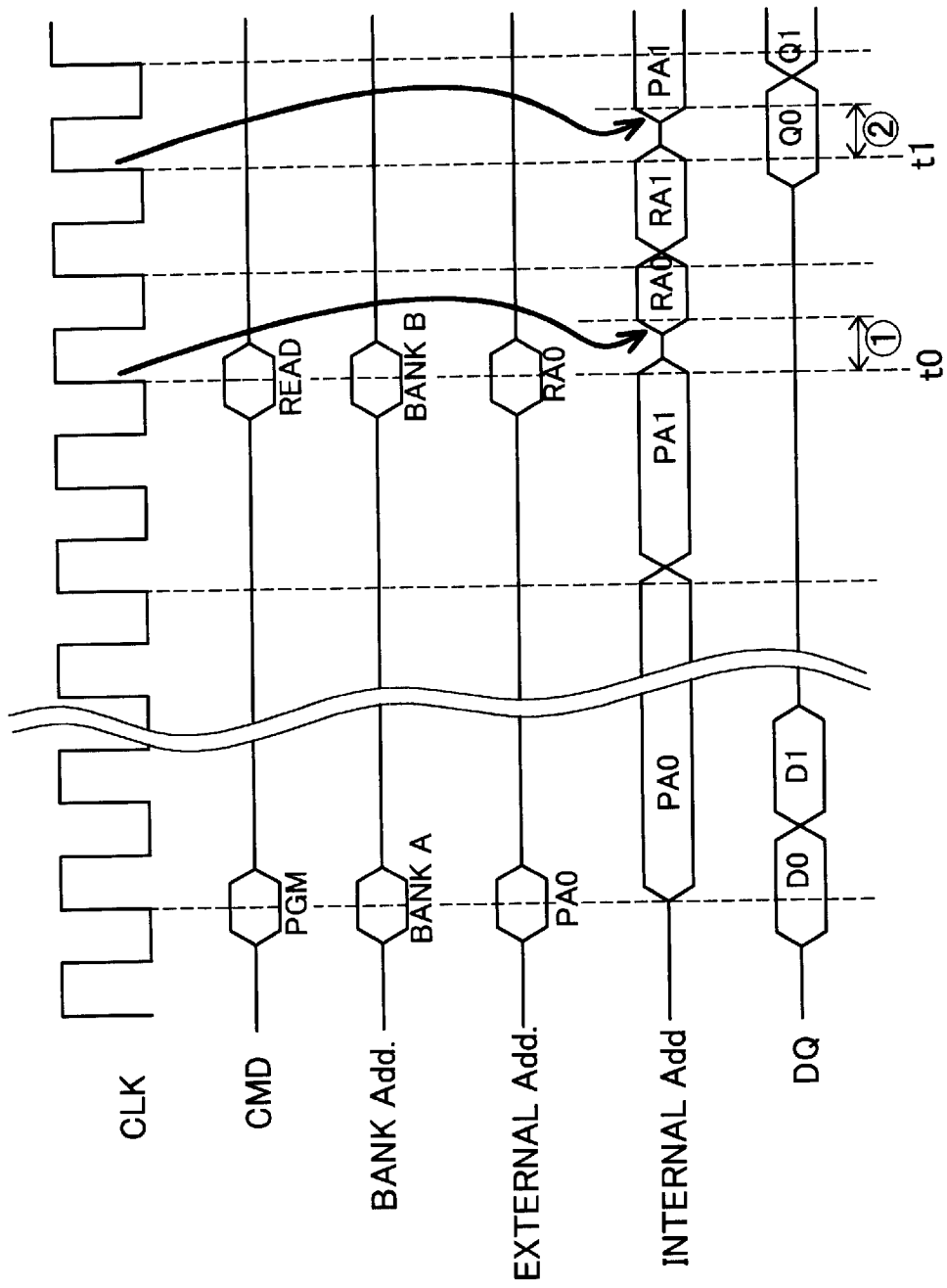
FIG. 6 is a burst operation timing chart of a conventional flash memory.

FIG. 2 is a bust-operation timing chart on under the same conditions as burst operation of the conventional flash memory shown in FIG. 6. That is, it is an example of burst operation in case of write (program) latency=0 and readout latency=2. However, it should be noted that the FIG. 1 is structured such that burst length for write (program)=3, and that for readout=n, whereas burst length of the related art=2.

When a write (program) command PGM for the Bank A (31) is received, a bank address (Bank Add.) is inputted as a bank selection signal Bn to make the Bank A (31) active. Furthermore, the inputted write (program) command PGM helps to generate a mode signal M internally. Going through the address control circuit 10, the mode signal M selects the switch S2 in the selective switch circuit 11 so that an output from the second address counter 8 should be connected to the internal address buses IA0 through IAn. Burst conditions are inputted and the number of burst at the second control counter 4 and that at the first control counter 2 are set to 3 and n, respectively at a timing not shown or a timing prior to an input of write (program) command PGM.

An external address (External Add.) PA0 inputted from the external address terminals A0 through An is inputted to the second address counter 8 as an initial address of write (program) operation mode. The external address (External Add.) PA0 outputted from the second address counter 8 is held in the address holding circuit 16 within the memory cell control circuit 12 of the Bank A (31) to start writing (programming) data to an objective address in the memory cell array 14. Length of write (program) time corresponds to a second cycle triggered off by a divided signal TA from the divider A1 or a signal TB from the program/erase completion detecting circuit B1.

When a divided signal TA or a signal TB is outputted, decrement of burst value at the second control counter 4 is made by 1 and at the same time, increment of the present internal address (Internal Add.) PA0 is made to be a second write (program) address PA1. Regarding internal address (Internal Add.) of the Bank A shown in FIG. 2, (A) shows operation directed to signal TA and (B) shows operation directed to signal TB. In FIG. 2, when a read command READ for the Bank B (32) is received at time t0, one cycle of external clock signal CLK after the increment of internal address number, burst-read operation begins. A reference address of the read command READ is an external address RA0. Similar to case of an input of a write (program) command PGM, when a read command READ is inputted, the present mode signal M is switched to another one. As a result, a signal from the address control circuit 10 helps to switch from the switch S2 to the switch S1 in the selective switch circuit 11 and a signal outputted from the first address counter 6 is connected to the internal address buses IA0 through IAn. At the same time, the bank address (Bank Add.) is switched from Bank A (31) to Bank B (32), thereby to activate the Bank B (32) in response to a bank selection signal Bn.

Furthermore, an external address (External Add.) RA0 inputted from the external address terminals A0 through An is inputted to the first address counter 6 as an initial address of burst-readout mode. The external address (External Add.) RA0 outputted from the first address counter 6 is held in the address holding circuit 16 installed in the memory cell control circuit 12 of the Bank B (32). Then, readout operation starts and data is readout from an objective address in the memory cell array 14. Both the first address counter 6 and the first control counter 2 receive inputs of the external clock signals CLK, thereby to make increments of addresses and decrements burst values along with a first cycle that corresponds to cycle(s) of the external clock signal CLK. Since length of burst-readout is set to n the first control counter 2, increments of address for the first address counter 6 are made n cycles in a row.

Burst-readout operation at the Bank B (32) starts in the middle of write (program) operation to the address PA1 in the Bank A (31). Each bank has an address holding circuit 16 in which an address that designates a memory cell in access is held. Accordingly, an address of a memory cell to which write operation for the Bank A (31) is applied is held in the address holding circuit 16. Therefore, even if the present operation mode (write operation mode) is switched to another mode in the middle of the write (program) operation and the objective bank is changed to another one, the write (program) operation can be kept based on the address held in the address holding circuit 16. FIG. 2 shows that during a cycle where burst-readout operation to the Bank B (32) is conducted write (program) operation to an address PA1 in the Bank A (31) is kept in parallel to the burst-readout operation. After the write (program) operation is completed (time t2), a subsequent burst-write (program) operation to the Bank A (31) is suspended until the burst-readout operation to the Bank B (32) is completed (time t1). In FIG. 2, a period from time t2 till time t1 corresponds to a suspension period. This is because, the non-volatile semiconductor memory device 1 has only one set of a first address counter 6, a second address counter 8, a first control counter 2, and a second control counter 4 as elements for controlling burst operation, and burst operation is conducted bank by bank.

When a burst-readout operation period (time to till t1) terminates, the bank selection signal Bn and a mode signal M are switched in response to termination of a readout command READ. Then, the Bank A (31) is activated and the switch S2 in the selective switch circuit 11 is selected whereby an increment of the write (program) address held in the second address counter 8 is made to PA2 from PA1 and the burst-write program operation is resumed.

As described, in the non-volatile semiconductor memory device 1 directed to the First Embodiment, there are provided a first address counter 6 and a second address counter 8 wherein the first address counter 6 works along with a first cycle for readout operation while the second address counter 8 for write (program) or erase operation works along with a second cycle. Therefore, there occurs no scramble for an internal address to be allocated for each operation mode. That is, even if operation modes are changed, appropriate addresses can be outputted to the internal address buses IA0 through IAn at any time without initializing the first address counter 6 and the second address counter 8.

Furthermore, since the first address counter 6 and the second address counter 8 can allocate addresses in serial order following the first reference address PA0 and the second reference address RA0, respectively, each of the address counters 6 and 8 can allocate appropriate addresses in serial order independently following their respective reference addresses PA0 or RA0. That is, appropriate addresses can be outputted to the internal address IA0 through IAn at any time following the reference addresses PA0 and RA0 without initializing the first address counter 6 and the second address counter 8 among readout mode, write (program) mode, and erase mode.

Thus there are avoided serial complicated controls such as replacements of address values at the address counters 6 and 8, suspension of write (program) or erase operation due to the replacements, resumption of the suspended operation and the like. Since there occurs no delay time due to the complicated control operations, high-speed data transfer rate can be realized.

Furthermore, assuming that the divider A1 divides an external clock signal CLK and makes up a second cycle, a first cycle can be synchronized with an external clock signal CLK and at the same time, the second cycle longer than the first cycle also can be synchronized with an external clock signal CLK when an output from the divider A1 is regarded as second cycle. Both a first cycle and a second cycle can thus synchronize with an external clock CLK, thereby to facilitate setting of timing.

Still further, there is provided a write (program)/erase completion detecting circuit B1 for detecting completion of write (program) or erase operation to an address in write (program) or erase operation mode. A second cycle is determined based on a signal TB outputted from the write (program)/erase completion detecting circuit B1. Since completion of write (program) or erase operation that does not synchronize with an external clock signal CLK can be directly detected, a second cycle can be set with an appropriate timing.

By setting appropriate timing with the divider A1 or by confirming completion of operations with the write (program)/erase completion detecting circuit B1, even among readout mode synchronous with an external clock signal CLK and write (program) or erase operation mode asynchronous with an external clock signal CLK, addresses can be outputted to the internal address buses IA0 through IAn at any time with timing that agrees with the respective modes without operational conflicts regarding outputs of internal addresses and without initializing each of the address counters 6 and 8. Thus there are avoided serial complicated controls such as replacements of address values at the address counters 6 and 8, suspension of write (program) or erase operation due to the replacements, resumption of the suspended operation and the like. Since there occurs no delay time due to the complicated control operations, high-speed data transfer rate can be realized.

Furthermore, since both the first reference address RA0 for readout mode and the second reference address PA0 for write (program) or erase operation mode are inputted from the external, these reference addresses can be set at the external depending on operation mode. This is a preferable aspect.

Furthermore, since the first control counter 2 and the second control counter 4 control the number of bursting directed to the first address counters 6 and that directed to the second address counter 8 separately, the control counters 2 and 4 do not have to scramble for the number of bursting to be handled. Thereby, the number of bursting necessary for an operation can be handled at any time without initializing each of the control counters 2 and 4. Since there is no need to control and replace the numbers of bursting to be handled by the control counters 2 and 4, a delay time due to the replacement control never occurs and high-speed data transfer rate can be realized.

Still further, since the selective switch circuit 11 can select an address output corresponding to readout mode, write (program) mode, or erase mode from the address counters 6 or 8, the three different operation modes do not have to scramble for an address allocated in the internal. Thereby, an appropriate address can be selectively outputted to the internal address buses IA0 through IAn at any time without initializing each of the address counters 6 and 8. Thus there are avoided serial complicated controls such as replacements of address values at the address counters 6 and 8, suspension of an operation due to the replacements, resumption of the suspended operation and the like. Since there occurs no delay time due to the complicated control operations, high-speed data transfer rate can be realized.

Since each bank has an address holding circuit 16, an address in the middle of operation can be held and operation for the address held can be kept and terminated for sure even if a bank subject to operation is switched to another.

Figure 3:
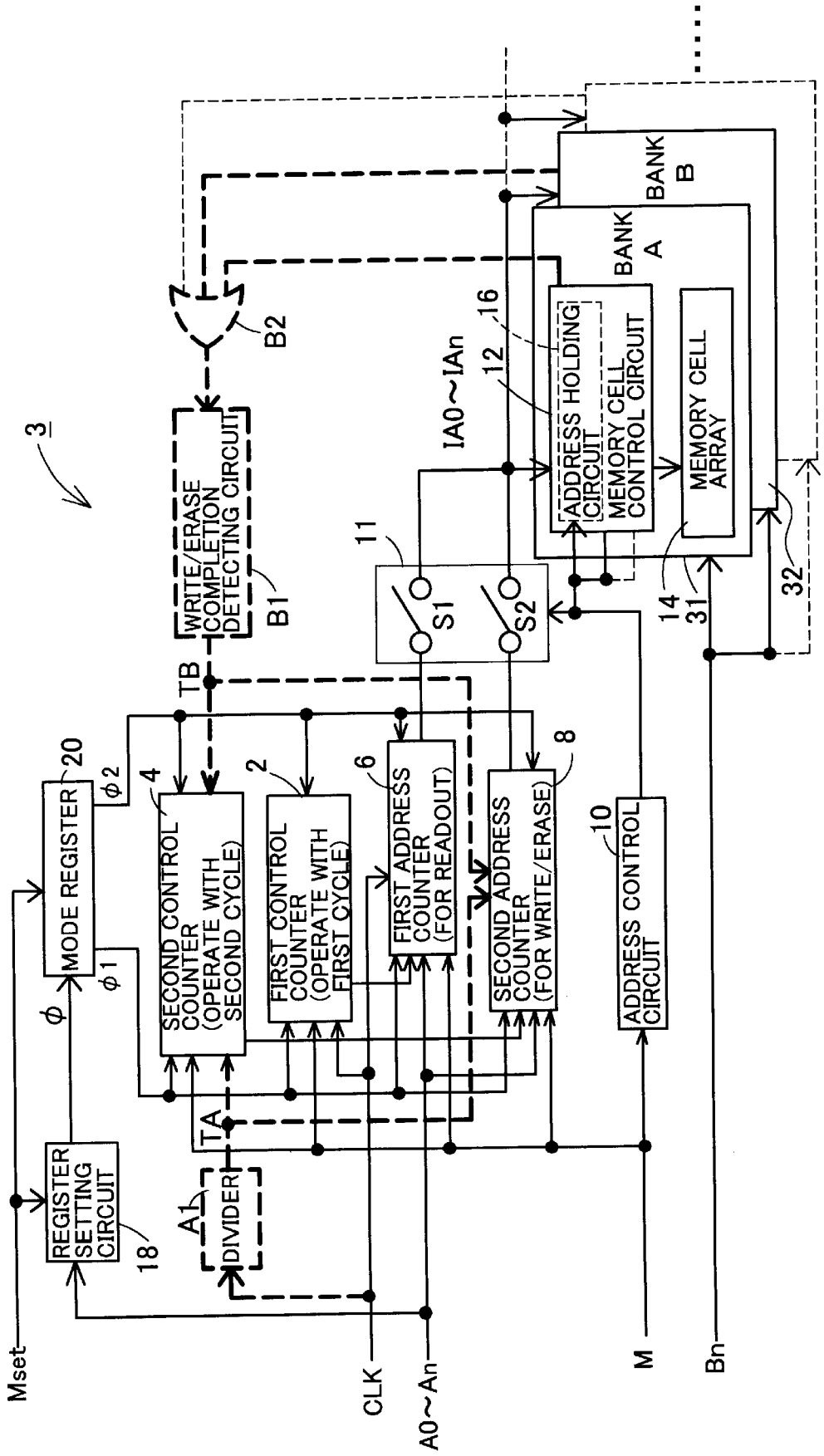
FIG. 3 is a circuit block diagram of a non-volatile semiconductor memory device directed to Second Embodiment.

As shown in FIG. 3, a circuit block diagram for a non-volatile semiconductor memory device 3 directed to a Second Embodiment includes a register setting circuit 18 and a mode register 20, in addition to all the circuit elements of the non-volatile semiconductor memory device 1 directed to the First Embodiment. A mode setting signal Mset is inputted to the register setting circuit 18 and the mode register 20. Furthermore, the register setting circuit 18 outputs a burst-information signal $\phi$ to set the mode register 20. A burst-information signal $\phi$ corresponds to an input signal inputted from external address terminals A0 through An. Burst information set in the mode register 20 is inputted to a first address counter 6, a second address counter 8, a first control counter 2 and a second control counter 4. In the non-volatile semiconductor memory device 3, information such that burst type=$\phi1$, bust length=$\phi2$ is outputted as typical burst-information. Here, "burst type=$\phi1$" means addressing method of burst operation. As typical methods of that, there can be raised sequential addressing method and interleave addressing method. Furthermore, "bust length= $\phi2$" indicates the number of cycles to conduct burst operation. It should be noted that other than the above-mentioned points, the structure of the Second Embodiment is identical to that of the First Embodiment.

In the Second Embodiment, the burst information$\phi1$ and $\phi2$ set in the mode register 20 is given to the first address counter 6, the second address counter 8, the first control counter 2 and the second control counter 4 so as to set an addressing method and a burst length. The burst information$\phi1$ and $\phi2$ is set during a mode register setting cycle previous to memory cell access operation such as readout, write (program), erase or the like. Along with input timing of a mode setting signal Mset from the external address terminals A0 through An, the burst information is inputted as address code information for mode setting, decoded by the register setting circuit 18, and finally recorded in the mode register 20 as a burst information signal$\phi$.

Once a burst information signal$\phi$ is determined and set in the mode register 20 during a mode register setting cycle, burst length $\phi2$, the information from the mode register 20, is set in the first control counter 2 and the second control counter 4 and burst type $\phi1$, another information from the mode register 20, determines a manner of address increment. After that, memory cell access operations such as typical readout, write (program), erase or the like start. These access operations are conducted in the same manners as the First Embodiment. Therefore, details of the access operation will not be described.

As described in the above, in the non-volatile semiconductor memory device 3, the register setting circuit 18 and the mode register 20 give burst information to the address counters 6, 8 and the control counters 2,4 to set these counters appropriately previous to readout, write (program), and erase operation. Accordingly, the three different operation modes do not have to scramble for an address allocated in the internal. Thereby, an appropriate address can be selectively outputted to the internal address buses IA0 through IAn at any time without initializing each of the address counters 6 and 8. Thus there are avoided serial complicated controls such as replacements of address values at the address counters 6 and 8, suspension of an operation due to the replacements, resumption of the suspended operation and the like. Since there occurs no delay time due to the complicated control operations, high-speed data transfer rate can be realized.

Figure 4:
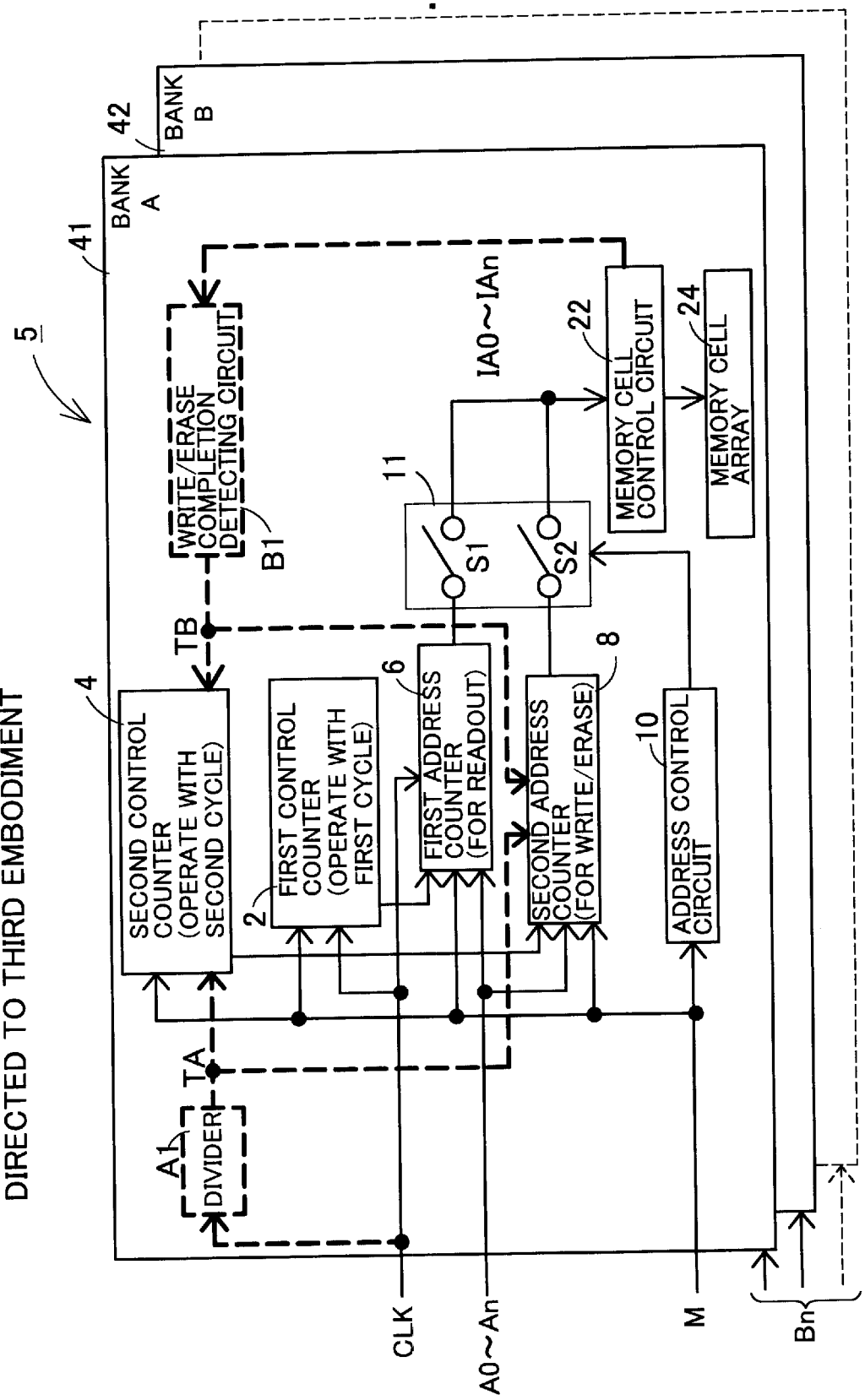
FIG. 4 is a circuit block diagram of a non-volatile semiconductor memory device directed to Third Embodiment.

As shown in FIG. 4, a circuit block diagram for a non-volatile semiconductor memory device 5 directed to a Third Embodiment, each bank (Bank A (41), Bank B (42) . . . ) has address control sections for burst operation such as a first address counter 6, a second address counter 8, a first control counter 2, a second control counter 4 and the like instead of the circuit block diagram of FIG. 1 directed to the First Embodiment wherein address control sections and banks are laid out separately.

The circuit structure such as above enables the non-volatile semiconductor memory device 5 to conduct burst operations bank by bank in parallel to one another regardless of operation mode differences. In the Third Embodiment, each bank has its own first address counter 6 and second address counter 8. Accordingly, there is no need to install an address holding circuit 16 within a memory cell control circuit 12, while memory cell control circuits 12 of the First and Second Embodiments need address holding circuits 16. Individual elements constituting the address control sections are identical to those for the First Embodiment and work similarly. Therefore, details of these items will not be described.

Figure 5:
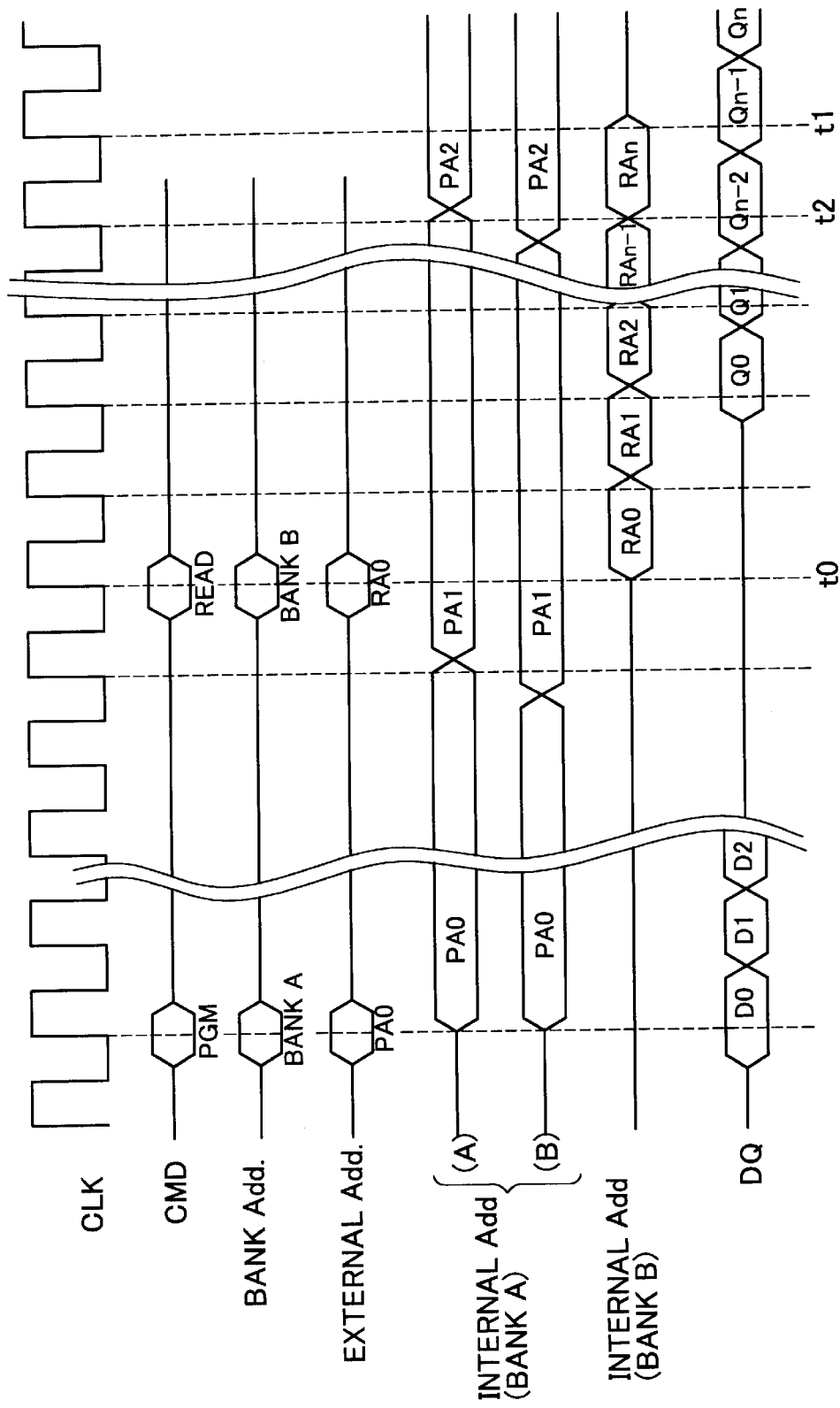
FIG. 5 is a burst operation timing chart of the non-volatile semiconductor memory device directed to Third Embodiment.

Burst operation timing chart of FIG. 5 shows that different operations are conducted in parallel to one another bank by bank independently, instead of the burst operation timing chart of FIG. 2 directed to the First Embodiment. Similar to the First Embodiment, burst conditions of the Third Embodiment are set to: write (program) latency=0; readout latency= 2. It is also similar to the First Embodiment that burst length of write (program) and that of readout are set to 3 and n, respectively. Furthermore, timing to input a write (program) command PGM to the Bank A (41) and timing to input a readout command READ to the Bank B (42) are similar to the case of the First Embodiment.

In the Third Embodiment, address control sections such as address counters 6 and 8 and the like are provided for each of the Bank A (41) and Bank B (42). Accordingly, even if burst-readout operation for the Bank B (42) is inserted while burst-write (program) operation is being conducted for an address PA1 in the Bank A (41), the second address counter 8 and the second control counter 4 of the Bank A (41) can keep addressing control for the burst (program) operation. On the other hand, as for the Bank B (42), the first address counter 6 and the first control counter 2 can keep addressing control for the burst-readout operation. That is, addressing control for the Bank A (41) and that for the Bank B (42) can be conducted separately. Therefore, with such structure, operations can be done bank by bank in parallel.

In FIG. 5, while burst-readout operation is being conducted for the Bank B (42) wherein outputs from the first address counter 6 go through the switch S1 in the selective switch circuit 11 to output addresses RA0 through RAn to the internal address buses IA0 through IAn and deliver the outputs to designated memory cells through the memory cell control circuit 22, burst-write operation for the Bank A (41) is kept wherein outputs from the second address counter 8 go through the switch S2 in the selective switch circuit 11 to output addresses PA1 and PA2 to the internal address buses IA0 through IAn and deliver the outputs to designated memory cells through the memory cell control circuit 22.

As described, in the non-volatile semiconductor memory device 5 directed to the Third Embodiment, each bank (Bank A (41), Bank B (42) . . . ) has its own first address counter 6 and second address counter 8 that are required for readout, write (program), and erase operation modes. Therefore, even if banks are activated in different operation modes, operations at respective banks can be kept independently without being influenced by other activated banks. Thus there are avoided serial complicated controls such as replacements of address values at the address counters 6 and 8, suspension of an operation due to the replacements, resumption of the suspended operation and the like. Since there occurs no delay time due to the complicated control operations, high-speed data transfer rate can be realized.

The present invention is not confined to the foregoing the First through and Third Embodiments, but various modifications and alterations are obviously possible within the scope of the substance of the invention.

For example, in the First though Third Embodiments, interleave operation between burst-readout operation and burst-write (program) operation is described as an example. However, combination of interleave operation is not limited to the combination of burst-readout operation and burst-write (program) operation. Even if it is combination of burst-readout operation and burst-erase operation, instead of burst-write (program) operation, interleave operation with high-speed responsibility can be realized. Furthermore, interleave operation does not necessarily accompany burst operations. Interleave operation is feasible for an operation directed to successive addresses other than burst operation and for combination of burst operation and single operation.

Furthermore, interleave operation is feasible for arbitrary combinations among readout, write (program) and erase.

Still further, other than readout, write (program) and erase operations, interleave operation is feasible for any combinations of operation modes as long as each operation mode has different operation cycle.

Not to mention, the register setting circuit 18 and the mode register 20 of the Second Embodiment are applicable to the Third Embodiment.

The First through Third Embodiments describe interleave operation between banks. However, it is possible to suspend erase operation and insert either readout operation or write (program) operation within single bank. These operational combinations (erase-readout, erase-write) are feasible because erase operation does not always need to use data lines whereas readout and write (program) operations need to use data lines. In this case, provided that the second address counter 8 is used for erase operation, the first address counter 6 is selected after the erase operation is interrupted. However, by holding an address in the middle of erase operation within the second address counter 8, erase operation can be resumed with the address held in the second address counter 8. Further on, with two address holing circuits, one for the first address counter 6 and the other for the second address counter 8, suspension and resumption of erase operation can be realized.

According to the present invention, the inventive semiconductor memory device and non-volatile semiconductor memory device have a plurality of operation modes that are different in operation speed, namely, a first address counter that starts operation with the first cycle when inputting a reference external address and a second address counter that starts operation with the second cycle that is longer than the first cycle when inputting a reference external address, wherein outputs from the two address counters can be controllably switched by the selective switch. Coping with the plurality of operation modes different in operation speed, the semiconductor memory device and non-volatile semiconductor memory device can enhance their continuous operation conducted by generating addresses continuously from the two address counters. Even when operation modes are switched, there occurs no operational conflicts regarding outputs of internal addresses. Therefore, there can be provided a semiconductor memory device and a non-volatile semiconductor memory device capable of realizing high-speed data transfer rate as fast as SDRAM and the like.

What is claimed is:

1. A semiconductor memory device having a first operation mode operable with a first cycle and a second operation mode operable with a second cycle that is longer than the first cycle, the semiconductor memory device comprising:
   a first address counter that generates addresses with the first operation mode based on a first reference address inputted from an external section; and
   a second address counter that generates addresses with the second operation mode based on a second reference address inputted from the external section.

2. The semiconductor memory device according to claim 1, wherein the first address counter generates addresses in serial order subsequent to the first reference address by the first cycle and the second address counter generates addresses in serial order subsequent to the second reference address by the second cycle.

3. The semiconductor memory device according to claim 1, wherein the first cycle for the first operation mode is generated in synchronous with clock signal supplied from an external section.

4. The semiconductor memory device according to claim 1, wherein the second cycle for the second operation mode is generated in synchronous with clock signal supplied from an external section.

5. The semiconductor memory device according to claim 4 further including a divider that generates the second cycle by dividing clock signal supplied from, an external section.

6. The semiconductor memory device according to claim 1 further including a detector for detecting completion of operation to an address in the second operation mode, wherein the second cycle is determined by an output from the detecting section.

7. The semiconductor memory device according to claim 1 further including:
   a first control counter for handling address numbers that the first address counter generates in the first operation mode; and
   a second control counter for handling address numbers that the second address counter generates in the second operation mode.

8. The semiconductor memory device according to claim 1 further including a selective switch that selects address outputs from the first address counter in the first operation mode and selects address outputs from the second address counter in the second operation mode.

9. The semiconductor memory device according to claim 1 further including a mode setting section for setting operation mode to either the first operation mode or the second operation mode, wherein the mode setting section makes at least one of the following selections:
   a selection, the first address counter or the second address counter;
   a selection, the first control counter or the second control counter; and
   a selection, address outputs from the first address counter or those from the second address counter, both of which selected by the selective switch.

10. The semiconductor memory device according to claim 1, wherein at least one of the first and the second operation modes corresponds to at least one of the following modes, namely, readout mode, write mode, erase mode, that are operated for memory cells corresponding to more than two addresses continuously with either the first cycle or the second cycle.

11. The semiconductor memory device according to claim 1, in case memory cell groups comprising units of a predetermined number of memory cells are handled separately by each predetermined address region, the semiconductor memory device further comprising an address holding circuit for holding addresses of memory cells subject to operation by the each predetermined address region.

12. The semiconductor memory device according to claim 1, in case memory cell groups comprising units of a predetermined number of memory cells are handled separately by each predetermined address region, a set of the first address counter and the second address counter is provided for each of the predetermined address regions.

13. A semiconductor memory device having a first operation mode operable with a first cycle and a second operation mode operable with a second cycle that is longer than the first cycle, the semiconductor memory device comprising:
   a first address counter that generates addresses in serial order subsequent to a first reference address inputted from an external section by first cycle generated in synchronous with a clock signal supplied from the external section with the first operation mode; and
   a second address counter that generates addresses in serial order subsequent to a second reference address inputted from the external section by second cycle generated asynchronous with a clock signal supplied from the external section with the second operation mode.

14. The semiconductor memory device according to claim 13 further including a detecting section for detecting completion of operation to an address in the second operation mode, wherein the second cycle is determined by an output from the detecting section.

15. The semiconductor memory device according to claim 13 further including:
   a first control counter for handling address numbers that the first address counter generates in the first operation mode; and
   a second control counter for handling address numbers that the second address counter generates in the second operation mode.

16. The semiconductor memory device according to claim 13 further including a selective switch that selects address outputs from the first address counter in the first operation mode and selects address outputs from the second address counter in the second operation mode.

17. The semiconductor memory device according to claim 13 further including a mode setting section for setting operation mode to either the first operation mode or the second operation mode, wherein the mode setting section makes at least one of the following selections:
   a selection, the first address counter or the second address counter;
   a selection, the first control counter or the second control counter; and a selection, address outputs from the first address counter or those from the second address counter, both of which selected by the selective switch.

18. The semiconductor memory device according to claim 13, wherein at least one of the first and the second operation modes corresponds to at least one of the following modes, namely, readout mode, write mode, erase mode, that are operated for memory cells corresponding to more than two addresses continuously with either the first cycle or the second cycle.

19. The semiconductor memory device according to claim 13, in case memory cell groups comprising units of a predetermined number of memory cells are handled separately by each predetermined address region, the semiconductor memory device further comprising an address holding circuit for holding addresses of memory cells subject to operation by the each predetermined address region.

20. The semiconductor memory device according to claim 13, in case memory cell groups comprising units of a predetermined number of memory cells are handled separately by each predetermined address region, a set of the first address counter and the second address counter is provided for each of the predetermined address regions.

21. A non-volatile semiconductor memory device having readout mode operable with first cycle and write mode or erase mode operable with second cycle that is longer than the first cycle, the non-volatile semiconductor memory device comprising:

a first address counter that generates addresses in serial order subsequent to a first reference address inputted by an external section by the first cycle generated in synchronous with a clock signal supplied from the external section with the readout mode; and a second address counter that generates addresses in serial order subsequent to a second reference address inputted by the external section by the second cycle generated in synchronous with a clock signal supplied from the external section with either the write mode or the erase mode.

22. The non-volatile semiconductor memory device according to claim 21 further including a divider that generates the second cycle by dividing clock signal supplied from an external section.

23. The non-volatile semiconductor memory device according to claim 21 further including:

a first control counter for handling address numbers that the first address counter generates in the readout mode; and a second control counter for handling address numbers that the second address counter generates in the write mode or the erase mode.

24. The non-volatile semiconductor memory device according to claim 21 further including a selective switch that selects address outputs from the first address counter in the readout mode and selects address outputs from the second address counter in the write mode or the erase mode.

25. The non-volatile semiconductor memory device according to claim 21 further including a mode setting section for setting operation modes of readout mode, write mode, or erase mode, wherein the mode setting section makes at least one of the following selections:

a selection, the first address counter or the second address counter; a selection, the first control counter or the second control counter; and a selection, address outputs from the first address counter or those from the second address counter, both of which selected by the selective switch.

26. The non-volatile semiconductor memory device according to claim 21, wherein at least one of the three operation modes, namely, readout, write, and erase modes is an operation conducted for memory cells corresponding to more than two addresses continuously with either the first cycle or the second cycle.

27. The non-volatile semiconductor memory device according to claim 21, in case memory cell groups comprising units of a predetermined number of memory cells are handled separately by each predetermined address region, the non-volatile semiconductor memory device further comprising an address holding circuit for holding addresses of memory cells subject to operation by the each predetermined address region.

28. The non-volatile semiconductor memory device according to claim 21, in case memory cell groups comprising units of a predetermined number of memory cells are handled separately by each predetermined address region, a set of the first address counter and the second address counter is provided for each of the predetermined address regions.

29. A non-volatile semiconductor memory device having readout mode operable with first cycle and write mode or erase mode operable with second cycle that is longer than the first cycle, the non-volatile semiconductor memory device comprising:

a first address counter that generates addresses in serial order subsequent to a first reference address inputted from an external section by the first cycle generated in synchronous with a clock signal supplied from the external section with the readout mode; and a second address counter that generates addresses in serial order subsequent to a second reference address inputted from the external section by the second cycle generated in asynchronous with a clock signal supplied from the external section with either the write mode or the erase mode.

30. The non-volatile semiconductor memory device according to claim 29 further including a detecting section for detecting completion of write operation or erase operation to an address in the write mode or in the erase mode, wherein the second cycle is determined by an output from the detecting section.

31. The non-volatile semiconductor memory device according to claim 29 further including:

a first control counter for handling address numbers that the first address counter generates in the readout mode; and a second control counter for handling address numbers that the second address counter generates in the write mode or the erase mode.

32. The non-volatile semiconductor memory device according to claim 29 further including a selective switch that selects address outputs from the first address counter in the readout mode and selects address outputs from the second address counter in the write mode or the erase mode.

33. The non-volatile semiconductor memory device according to claim 29 further including a mode setting section for setting operation modes of readout mode, write mode, or erase mode, wherein the mode setting section makes at least one of the following selections:

a selection, the first address counter or the second address counter;

a selection, the first control counter or the second control counter; and a selection, address outputs from the first address counter or those from the second address counter, both of which selected by the selective switch.

34. The non-volatile semiconductor memory device according to claim 29, wherein at least one of the three operation modes, namely, readout, write, and erase modes is an operation conducted for memory cells corresponding to more than two addresses continuously with either the first cycle or the second cycle.

35. The non-volatile semiconductor memory device according to claim 29, in case memory cell groups comprising units of a predetermined number of memory cells are handled separately by each predetermined address region, the non-volatile semiconductor memory device further comprising an address holding circuit for holding addresses of memory cells subject to operation by the each predetermined address region.

36. The non-volatile semiconductor memory device according to claim 29, in case memory cell groups comprising units of a predetermined number of memory cells are handled separately by each predetermined address region, a set of the first address counter and the second address counter is provided for each of the predetermined address regions.

* * * * *